United States Patent
Wang et al.

(10) Patent No.: US 10,670,969 B2
(45) Date of Patent: Jun. 2, 2020

(54) REVERSE PATTERN FORMATION COMPOSITION, REVERSE PATTERN FORMATION METHOD, AND DEVICE FORMATION METHOD

(71) Applicant: Merck Patent GmbH, Darmstadt (DE)

(72) Inventors: Xiaowei Wang, Iwata (JP); Tatsuro Nagahara, Kakegawa (JP)

(73) Assignee: AZ Electronic Materials (Luxembourg) S.A.R.L. (LU)

( * ) Notice: Subject to any disclaimer, the term of this patent is extended or adjusted under 35 U.S.C. 154(b) by 0 days.

(21) Appl. No.: 16/314,716

(22) PCT Filed: Jul. 3, 2017

(86) PCT No.: PCT/EP2017/066408
§ 371 (c)(1),
(2) Date: Jan. 2, 2019

(87) PCT Pub. No.: WO2018/007273
PCT Pub. Date: Jan. 11, 2018

(65) Prior Publication Data
US 2019/0204747 A1   Jul. 4, 2019

(30) Foreign Application Priority Data

Jul. 5, 2016   (JP) .................................. 2016-133502

(51) Int. Cl.
| G03F 7/36 | (2006.01) |
| G03F 7/075 | (2006.01) |
| G03F 7/40 | (2006.01) |
| C09D 183/04 | (2006.01) |
| G03F 7/16 | (2006.01) |

(52) U.S. Cl.
CPC ............ *G03F 7/36* (2013.01); *C09D 183/04* (2013.01); *G03F 7/0757* (2013.01); *G03F 7/40* (2013.01); *G03F 7/16* (2013.01)

(58) Field of Classification Search
CPC .................................. G03F 7/36; G03F 7/0757
USPC ................................................ 430/270.1, 317
See application file for complete search history.

(56) References Cited

U.S. PATENT DOCUMENTS

| 2012/0045899 | A1 | 2/2012 | Maruyama et al. |
| 2013/0273741 | A1 | 10/2013 | Yamamoto |
| 2014/0234785 | A1 | 8/2014 | Hatakeyama et al. |
| 2016/0187782 | A1* | 6/2016 | Hustad ............. H01L 21/31144 438/703 |
| 2019/0041757 | A1* | 2/2019 | Wang ..................... G03F 7/405 |

FOREIGN PATENT DOCUMENTS

| JP | 2012185496 A | 9/2012 |
| WO | WO-2010123032 A1 | 10/2010 |
| WO | WO-2013182328 A1 | 12/2013 |

OTHER PUBLICATIONS

International Search Report for PCT/EP2017/066408 dated Sep. 8, 2017.
Written Opinion of the International Searching Authority for PCT/EP2017/066408 dated Sep. 8, 2017.

* cited by examiner

*Primary Examiner* — John S Chu
(74) *Attorney, Agent, or Firm* — Faegre Drinker Biddle & Reath LLP (57) ABSTRACT

[Problem] To provide a composition, which is a reverse pattern formation composition comprising an aqueous solvent having little influence on a resist pattern, and which is excellent in flatness and filling properties after coating and has excellent etching resistance. Furthermore, a method for forming a pattern using the same is provided. [Means for Solution] A reverse pattern formation composition comprising a polysiloxane compound comprising a repeating unit having a nitrogen-containing group and a solvent comprising water, and a method for forming a fine pattern using the same.

14 Claims, 2 Drawing Sheets

REVERSE PATTERN FORMATION COMPOSITION, REVERSE PATTERN FORMATION METHOD, AND DEVICE FORMATION METHOD

CROSS-REFERENCE TO RELATED APPLICATIONS

This application is a national stage application (under 35 U.S.C. § 371) of PCT/EP2017/066408, filed Jul. 3, 2017, which claims benefit of Japanese Application No. 2016-133502, filed Jul. 5, 2016, both of which are incorporated herein by reference in their entirety.

BACKGROUND OF THE INVENTION

Technical Field

The present invention relates to a reverse pattern formation composition, a reverse pattern formation method using the same, and a device formation method using the same.

Background Art

In recent years, needs for high integration of LSI has been growing, and making a pattern finer is requested. In order to meet such needs, a lithography process using short wavelengths such as KrF excimer laser (248 nm), ArF excimer laser (193 nm) and extreme ultraviolet ray (EUV; 13 nm), X-ray, electron beam and the like has been coming into practical use. In order to cope with such a fine processing of resist pattern, a photosensitive resin composition to be used as a resist at the time of microfabrication is also required to have high resolution.

With promotion of the microfabrication, it is sometimes difficult to perform accurate processing merely by processing a ground substrate using a resist as a mask. Therefore, a method for processing a ground substrate using a reverse pattern formed by applying a reverse pattern formation composition on a resist pattern has been proposed (Patent Documents 1 and 2).

PRIOR ART DOCUMENTS

Patent Documents

[Patent Document 1] WO 2010/123032
[Patent Document 2] JPA-2012-185496

SUMMARY OF THE INVENTION

Problems to be Solved by the Invention

Since organic solvents are used in the reverse pattern formation composition disclosed in Patent Documents 1 and 2, it would be considered that the resist pattern is dissolved depending on its type and therefore an aqueous solvent of less influence on the resist pattern has been required. Further, there is room for improvement in flatness and filling properties when the composition is coated on a resist pattern. Furthermore, in the case of etching a ground substrate, in order to enable etching processing using a reverse pattern as a mask, etching resistance of the reverse pattern has been required to be sufficiently higher than that of the ground substrate, and improvement in LWR and LER after etching processing has been also required.

The present invention has been made based on the above-mentioned circumstances. The present invention provides a reverse pattern formation composition, in which a solvent comprising water is used, and which is excellent in flatness and filling properties after film formation and improves LWR and LER. Furthermore, a reverse pattern formation method using the same and a device formation method using the same are provided.

Means for Solving the Problems

The reverse pattern formation composition according to the present invention is characterized by comprising:
a polysiloxane compound which comprises a repeating unit represented by the following general formulae (I) or (II), wherein
$R^a$ is a nitrogen-containing substituent, where said nitrogen-containing substituent contains 1 to 12 carbon atoms and the atom directly bonded to Si is carbon in said nitrogen-containing substituent,
$R^b$ is a nitrogen-containing substituent, where said nitrogen-containing substituent contains 1 to 12 carbon atoms and the atom directly bonded to Si is carbon in said nitrogen-containing substituent, hydrogen, hydroxy, carboxy, $C_{1-12}$ alkyl, $C_{1-12}$ alkoxy, or $C_{1-12}$ hydroxyalkyl, and
a solvent comprising water.

Further, the reverse pattern formation method according to the present invention is characterized by comprising coating a developed resist pattern with the composition according to the present invention, to form a composition layer, and removing said resist pattern.

Furthermore, the processing method of a layer to be processed according to the present invention is characterized by comprising:
coating a layer to be processed with a resist composition, to form a resist composition layer;
exposing said resist composition layer to light;
developing the exposed resist composition layer with a developer, to form a resist pattern;
coating said resist pattern with the composition, to form a composition layer;
removing said resist pattern, to form a reverse pattern; and
processing said layer to be processed using said reverse pattern as a mask.

Effects of the Invention

According to the present invention, it is possible to provide a reverse pattern formation composition which is excellent in flatness and filling properties even when a film is formed on a resist pattern using the composition according to the present invention. The reverse pattern using the composition according to the present invention has high etching resistance and can improve LWR and LER.

DETAILED DESCRIPTION OF THE INVENTION

Mode for Carrying Out the Invention

Reverse pattern formation composition

The reverse pattern formation composition according to the present invention (hereinafter sometimes simply referred to as "composition") comprises a polysiloxane compound having a specific structure and a solvent comprising water. Hereinafter, each component contained in the composition according to the present invention will be described in detail.

(A) Polysiloxane Compound

The polysiloxane compound according to the present invention comprises a repeating unit represented by the following general formulae (I) or (II), wherein $R^a$ is a nitrogen-containing substituent, where said nitrogen-containing substituent contains 1 to 12 carbon atoms and the atom directly bonded to Si is carbon in said nitrogen-containing substituent, $R^b$ is a nitrogen-containing substituent, where said nitrogen-containing substituent contains 1 to 12 carbon atoms and the atom directly bonded to Si is carbon in said nitrogen-containing substituent, hydrogen, hydroxy, carboxy, $C_{1-12}$ alkyl, $C_{1-12}$ alkoxy, or $C_{1-12}$ hydroxyalkyl.

In the present invention, notations such as "$C_{x-y}$", "$C_x$-$C_y$" and "$C_x$" is taken to mean the number of carbons in a molecule or substituent. For example, $C_{1-6}$ alkyl means an alkyl chain (methyl, ethyl, propyl, butyl, pentyl, hexyl etc.) having a carbon chain of 1 to 6 carbon atoms.

$R^a$ preferably comprises —NH$_2$. More preferably, $R^a$ is $C_{1-12}$ aminoalkyl or $C_{2-12}$ N-(aminoalkyl)iminoalkyl.

Here, in the present invention, aminoalkyl is taken to mean —(CH$_2$)$_p$NH$_2$ (p is an integer of 1 to 12) and N-(aminoalkyl)iminoalkyl is taken to mean —(CH$_2$)$_q$—NH—(CH$_2$)$_r$—NH$_2$ (q is an integer of 1 to 12, r is an integer of 0 to 11, and q+r is an integer of 1 to 12).

Specific examples of preferable $R^a$ include —(CH$_2$)$_3$NH$_2$, —(CH$_2$)$_3$—NH—(CH$_2$)$_3$—NH$_2$, —(CH$_2$)$_3$NH—CH$_2$CH$_3$.

In particular, the compound, wherein $R^a$ is —(CH$_2$)$_3$NH$_2$ or —(CH$_2$)$_3$—NH—(CH$_2$)$_3$—NH$_2$, is preferable because the monomer as a raw material thereof is easily available and has good storage stability.

$R^b$ is preferably hydroxy or $C_{1-12}$ alkyl. More preferably, $R^b$ is hydroxy or methyl.

In said polysiloxane compound, the ratio of the sum of the repeating units represented by the general formulae (I) and (II) to the all repeating units is preferably 40 mol % or more, more preferably 50 mol % or more. In said polysiloxane compound, the ratio of the repeating units represented by formulae (I) and (II) to the all repeating units is preferably 40 mol % or more and 100 mol % or less, more preferably 50 mol % or more and 100 mol % or less.

In addition, said polysiloxane compound may be a copolymer of the repeating unit of the general formula (I) or (II) with a repeating unit of the following general formula (III) or (IV):

wherein, $R^c$ is independently hydrogen, hydroxy, carboxy, $C_{1-12}$ alkyl, $C_{1-12}$ alkoxy, or $C_{1-12}$ hydroxyalkyl). $R^c$ is preferably hydroxy, methyl or ethyl, more preferably hydroxy or methyl. Specifically, the copolymerization may be any of alternating copolymerization, random copolymerization, block copolymerization, graft copolymerization, or a mixture thereof. The ratio of the sum of the repeating units represented by the general formulae (III) and (IV) to the all repeating units is preferably 0 mol % or more and 60 mol % or less, more preferably 0 mol % or more and 50 mol % or less.

Further, said polysiloxane compound and other polymer that is not polymerized may be comprised. Here, the mass ratio of the other polymer to the total mass of the composition is preferably more than 0 mol % and 10 mol % or less, more preferably more than 0 mol % and 5 mol % or less.

The ratio of the number of amino groups to the number of Si atoms in said polysiloxane compound is preferably 30% or more and 100% or less, more preferably 40% or more and 100% or less, much more preferably 50% or more and 100% or less, from the viewpoint of ensuring solubility in a solvent comprising water. The ratio of the number of hydroxy groups to the number of Si atoms in said polysiloxane compound is preferably 0% or more and 150% or less, more preferably 0% or more and 100% or less, much more preferably 0% or more and 70% or less from the viewpoint of gelation of the silica.

The polysiloxane compound having the repeating unit represented by the general formula (II) has preferably a Si$_8$O$_{12}$ structure, in which Si atoms are positioned at the vertices of a hexahedron and each two Si atoms are connected to each other by way of an oxygen atom. Following is an example in the case wherein $R^a$ is aminopropyl.

However, a polysiloxane compound having a structure, in which the repeating unit represented by the general formula (I) or other repeating unit is connected to the repeating unit represented by the general formula (II) as a result of a partial cleavage of the hexahedral structure, can be also used in the composition according to the present invention.

Specific examples of the polysiloxane compound according to the present invention includes N-(2-aminoethyl)-3-aminopropylsiloxane, 3-aminopropylsiloxane, N-(1,3-dimethyl-butylidene)aminopropyl-siloxane, N-(1-methylpentylidenepropyl-3-amino)-siloxane, 4-piperidinyl-siloxane, 1-pyrazolinylsiloxane, N-phenyl-3-aminopropylsiloxane, 3-ureidopropylmethyl-siloxane, N-(1,3-dimethyl-butylidene)aminopropylsilsesqui-oxane, N-phenyl-3-aminopropylsilsesquioxane, and aminopropyl-silsesquioxane and the like. Among them, N-(2-aminoethyl)-3-aminopropylsiloxane, 3-aminopropyl-siloxane, aminopropylsilsesquioxane are preferable, since they are easily available.

The mass average molecular weight of the polysiloxane compound according to the present invention is usually 500 or more and 20,000 or less, preferably 500 or more and 5,000 or less, more preferably 1,000 or more and 3,000 or less. Here, the mass average molecular weight is the mass average molecular weight in terms of styrene by gel permeation chromatography.

(B) Solvent

The composition according to the present invention comprises a solvent comprising water. The composition according to the present invention is generally applied directly onto a resist pattern. As the result, a composition that does not cause deterioration of the pattern shape or the like by affecting the resist film is desirable. For this reason, the solvent is preferably an aqueous solvent having a high water content of little influence on a resist film. Typically, water is used as the solvent. Water to be used for such an aqueous solvent is preferably one from which organic impurities, metal ions and the like have been removed by distillation, ion exchange treatment, filter treatment, various adsorption treatments and the like.

To improve solubility of the components of the composition, said aqueous solvent may contain an organic solvent. As the organic solvent to be used in such a mixed solvent, any one from the following can be used depending on the purpose: (a) hydrocarbons, such as n-hexane, n-octane, cyclohexane, (b) alcohols, such as methyl alcohol, ethyl alcohol, isopropyl alcohol, (c) ketones, such as acetone, methyl ethyl ketone, (d) esters, such as methyl acetate, ethyl acetate, ethyl lactate, (e) ethers, such as diethyl ether, dibutyl ether, and (f) other polar solvents, such as dimethylformamide, dimethyl sulfoxide, methyl cellosolve, cellosolve, butyl cellosolve, cellosolve acetate, alkyl cellosolve acetate, butyl carbitol, carbitol acetate. Mixtures of these can also be used. Among these, $C_{1-20}$ alcohols, in particular methyl alcohol, ethyl alcohol or isopropyl alcohol, are preferred because they have little affect on the resist.

The mass ratio of said water to said solvent is preferably 60 mass % or more and 100 mass % or less, more preferably 80 mass % or more and 100 mass % or less. The solvent consisting only of water is also preferable.

Preferably, the mass ratio of said polysiloxane compound to the total mass of the composition is 0.5 mass % or more and 50 mass % or less, and the mass ratio of said solvent to the total mass of the composition is 1 mass % or more and 99.5 mass % or less. More preferably, the mass ratio of said polysiloxane compound to the total mass of the composition is 1 mass % or more and 20 mass % or less, and the mass ratio of said solvent to the total mass of the composition is 50 mass % or more and 99.5 mass % or less.

The composition according to the present invention essentially comprises (A) and (B) as described above, but further additives can be combined if necessary. These materials that can be combined are described below. Additionally, the components to be contained in the whole composition excluding (A) and (B) are preferably 5% or less, more preferably 2% or less, to the total weight.

Examples of further additives include, for example, surfactants, acids, bases, bactericides, antimicrobials, preservatives and/or antifungal agents and the like. These components should be used within the range of types and addition amounts that do not impair the effect of the present invention. One or more of these additives can be added to the composition.

The surfactant is used for the purpose of maintaining uniformity of the composition and improving coatability, and the like.

In order to maximize the effect of improving the surface roughness of the resist, the content of the surfactant in the composition is preferably 50 to 100,000 ppm, more preferably 50 to 50,000 ppm, most preferably 50 ppm to 20,000 ppm, based on the total mass of the composition. If the content of the surfactant is too much, problems such as poor development may occur, so that attention needs to be paid.

Acids or bases are used to adjust pH of the composition and to improve solubility of each component. In addition, bases can be added to control the diffusion distance of acid generated by exposure.

By this controlling of the diffusion distance, resolution is improved, sensitivity change after exposure can be suppressed, and substrate and environment dependence can be reduced. The acids or bases to be used can be arbitrarily selected as long as the effect of the present invention is not impaired, and examples thereof include carboxylic acids, amines and ammonium salts. These include fatty acids, aromatic carboxylic acids, primary amines, secondary amines, tertiary amines, and ammonium compounds, which may be substituted with any substituent. More specifically, they include formic acid, acetic acid, propionic acid, benzoic acid, phthalic acid, salicylic acid, lactic acid, malic acid, citric acid, oxalic acid, malonic acid, succinic acid, fumaric acid, maleic acid, aconitic acid, glutaric acid, adipic acid, monoethanolamine, diethanolamine, triethanolamine, triisopropanolamine, tetramethylammonium and the like.

The composition according to the present invention may further contain a bactericide, an antimicrobial, a preservative and/or an antifungal agent. These agents are used to prevent bacteria or fungi from propagating in aged composition. Examples of these include alcohols such as phenoxyethanol, isothiazolone and the like. BESTCIDE (trade name), commercially available from Nippon Soda Co., Ltd., is a particularly effective preservative, antifungal agent and bactericide. Typically, these additives do not affect the performance of the composition, and their content is usually 1% or less, preferably 0.1% or less, and preferably 0.001% or less, based on the total weight of the composition.

Pattern Formation Method

The reverse pattern formation method according to the present invention comprises coating a developed resist pattern with the composition according to the present invention, to form a composition layer, and removing said resist pattern, to form a reverse pattern. Hereinafter, a typical pattern formation method to which the composition according to the present invention is applied will be described in detail with reference to the drawings.

Figure 1:
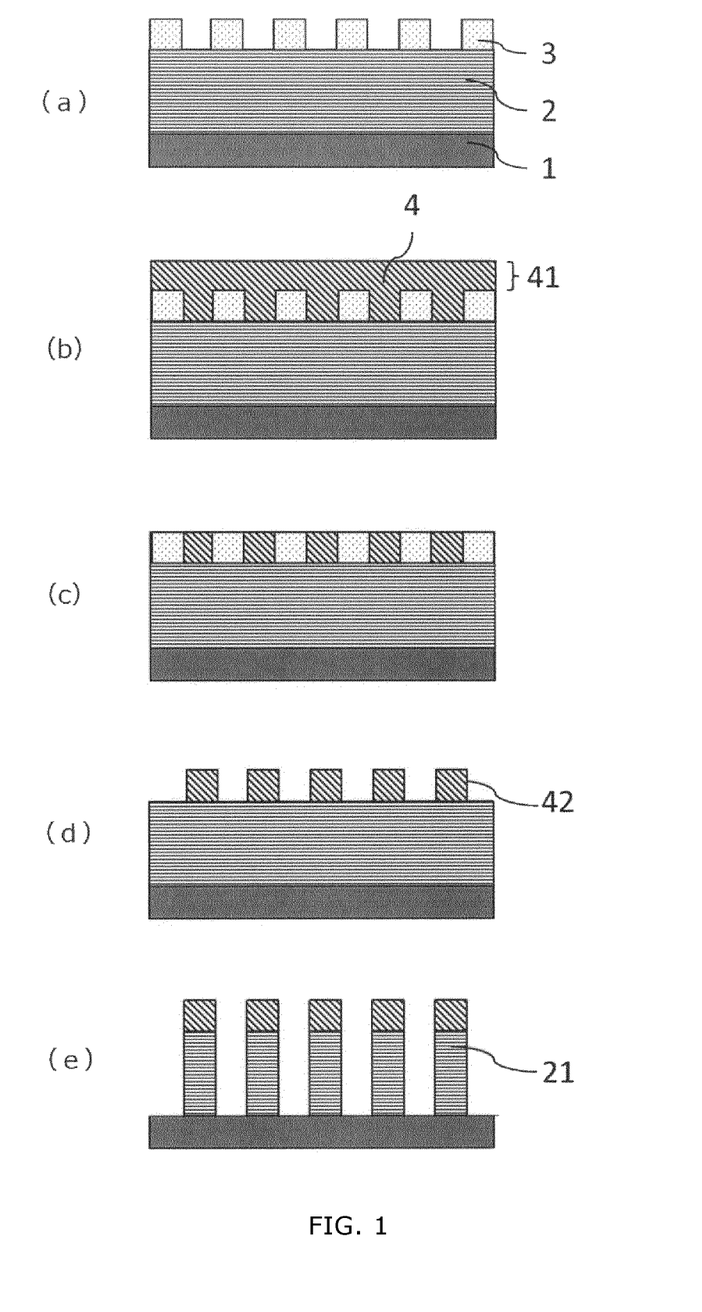
FIG. 1 is an explanatory drawing of a pattern formation method according to the present invention.

FIG. 1(a) shows a state in which an applied carbon coating (sometimes referred to also as Spin On Carbon coating) layer 2 is formed on a substrate 1 and a resist pattern 3 is formed thereon. This applied carbon coating corresponds to the layer to be processed in the present invention. In the present invention, the layer to be processed is a layer processed using a reverse pattern (mask) formed from the composition according to the present invention.

The substrate to be used is not particularly limited, and examples thereof include a semiconductor substrate (for example, a silicon wafer or the like), a glass substrate for an LCD, a PDP, and the like. A conductive film, wiring, semiconductor, or the like may be formed on the substrate.

The applied carbon coating can be formed by coating by means of a conventionally known method such as spin coating, and prebaking, to form a film. Further, the film may be formed by means of CVD (chemical vapor deposition) method or ALD (atomic layer deposition) method.

The resist pattern can be formed by, for example, applying a photoresist on an applied carbon coating layer by means of a conventionally known method such as spin coating, prebaking (for example, at a baking temperature of 70° C. or more and 140° C. or less for about 1 minute), thereafter exposing to ultraviolet ray such as g-line and i-line, far ultraviolet ray such as KrF excimer laser and ArF excimer laser beam, X-ray, electron beam and the like, optionally performing post-exposure baking (PEB) (for example, at a baking temperature of 50° C. or more and 140° C. or less), and thereafter carrying out the development, for example, by paddle development, to form a resist pattern. The development of the resist is usually carried out using an alkaline developer. As the alkaline developer, for example, a water solution or an aqueous solution of sodium hydroxide, tetramethylammonium hydroxide (TMAH) or the like is used. After the development processing, rinsing (cleaning) of the resist pattern is performed using a rinsing liquid. Here, the resist composition to be used is not particularly limited, and may be either of positive type or negative type; however, a positive type one is preferably used in the pattern formation method of the present invention.

In addition, as long as the effect of the present invention is not impaired, any other conventionally known layer such as an antireflection film layer, a hard mask layer, or the like may be formed. Further, in the case where the applied carbon coating layer is formed, it may be formed with multiple layers.

FIG. 1 (b) shows a state in which the composition according to the present invention is coated on the formed resist pattern, to form the composition layer 4. The coating method is not particularly limited, and the coating can be done, for example, by a method for dropping and spreading the composition onto the substrate surface while rotating the substrate at 300 rpm or more and 4,000 rpm or less, a method for dropping the composition onto the substrate surface while standing the substrate still and thereafter spreading the composition by rotating the substrate at 300 rpm or more and 4,000 rpm or less, a method for immersing the substrate, or supplying the composition through spraying or blowing. Among them, a method for dropping and spreading the composition onto the substrate surface while rotating the substrate at 300 rpm or more and 4,000 rpm or less and a method for dropping the composition onto the substrate surface while standing the substrate still and thereafter spreading the composition by rotating the substrate at 300 rpm or more and 4,000 rpm or less are preferable. If necessary, the composition is baked after being coated. The baking temperature is usually 25° C. or more and 200° C. or less, more preferably 25° C. or more and 125° C. or less. The baking time is usually 30 seconds or more and 300 seconds or less, more preferably 30 seconds or more and 180 seconds or less. Here, it is preferable that the composition layer has a film thickness thicker than the resist layer and that the film thickness is the degree to which resist pattern is covered. Specifically, the film thickness of the composition layer is usually 5 nm or more and 1,000 nm or less, more preferably 5 nm or more and 500 nm or less.

Figure 2:
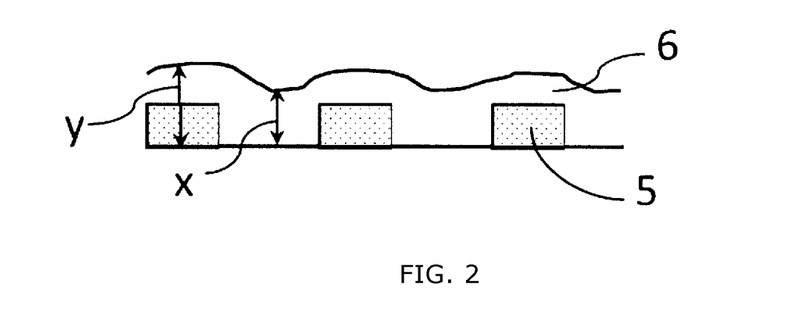
FIG. 2 is a schematic diagram of a layer formed on a resist pattern.

Here, FIG. 2 shows a typical schematic diagram in the case where a coating layer is formed on a resist pattern by a coating method. In general, the film thickness of the coating layer 6 becomes thin in the portion where the resist pattern 5 is not present (the film thickness in this case is x), and the film thickness of the coating layer becomes thick in the portion where the resist pattern is present (the film thickness in this case is y), which shows that the coating layer tends to follow the shape of the resist pattern. Here, y−x is defined as a level difference in the present invention. In general, the smaller the level difference is, the more preferable it is, and the composition according to the present invention is characterized in that it is possible to further reduce the level difference generated at the time of coating as compared with conventional compositions.

FIG. 1 (c) shows a state in which the surplus composition layer 41 is reduced by etch-back from the state of FIG. 1 (b), and the resist surface is exposed. In the present invention, the surplus composition layer or surplus layer refers to the surplus part that is present in the upper part of the composition layer than the surface of the resist pattern. In other words, in the method of the present invention, as shown in FIG. 1 (c), the surface of the resist pattern is exposed, but the composition layer in the upper part than the surface of the resist pattern becomes surplus. In the present invention, this surplus part is referred to as a surplus layer.

The method of etch-back is not particularly limited, and it is also possible to reduce only the composition layer by dry etching, for example, with $CF_4$ gas, to expose the resist surface and planarize the surface.

Further, in another embodiment, the etch-back process can be dispensed with by adjusting the amount of the composition according to the present invention to be coated onto the resist pattern. Specifically, an appropriate amount of the composition is coated onto the resist pattern of FIG. 1 (a) to achieve the state of FIG. 1 (c), or a composition slightly deficient to the above amount can be coated. By coating the composition according to the invention in this manner, the etch-back process described above can be dispensed with.

FIG. 1 (d) shows a state in which the resist pattern is removed from the state of FIG. 1 (c), to form the reverse pattern 42. The method for removing the resist pattern is not particularly limited, and it may be wet etching or dry etching.

FIG. 1 (e) shows a state in which the applied carbon coating layer is etched using the reverse pattern as a mask, to form the coated carbon film pattern 21. This etching may be dry etching or wet etching. In the case of dry etching, the type of gas is not particularly limited, and gases such as oxygen system, nitrogen system and/or Ar system are usually used. Further, when the composition according to the present invention is used, it is also possible to carry out the resist removal and the etching of the applied carbon coating layer (the layer to be processed) by a single continuous dry etching. In this way, there is no need to perform each independently the resist removal and the processing of the applied carbon coating layer; therefore, it is one of the advantages of the present invention that the manufacturing process can be simplified.

Thereafter, the reverse pattern is removed. Then, if necessary, the substrate is further processed, to form a device. For these further processings, any conventionally known method can be applied. After forming the device, if necessary, the substrate is cut into chips, connected to a lead frame, and packaged with resin. In the present invention, this packaged product is referred to as a device.

The present invention is explained below by use of several examples.

As the polysiloxane compound, polysiloxane compounds A to J having the following structures were used in Examples.

As the polysiloxane compound, Polysiloxane Compounds K and L having the following structures were used in Comparative Examples.

polysiloxane compound K (m:n = 90:10 random bond)

polysiloxane compound L (m:n:p = 5:35:65 random bond)

Among the above polysiloxane compounds, synthesis methods of Polysiloxane Compounds A, D, J and K are described below.

Synthesis of Polysiloxane Compound A: Preparation of Aminopropylsiloxane 100 ml of 3-aminopropyltriethoxysilane was introduced in a 500 ml flask. Then, while ice-water bathing the flask, 100 ml of pure water was added dropwise to the flask for 10 minutes using a dropping funnel. After stirring the product in the flask for 30 minutes, the flask was taken out from the ice-water bath and the stirring was conducted at room temperature for 1 hour. Ethanol as a by-product was removed from the product under the conditions of reduced pressure (30 Torr, for 1 hour) at 60° C., to obtain Polysiloxane Compound A. After evaporating moisture in an oven, concentration of the product was measured using Weight reduction method. The yield was 54%. The molecular weight of the product was measured by GPC, and the number average molecular weight was 1,178 and the mass average molecular weight was 1,470, in terms of polystyrene.

Synthesis of Polysiloxane Compound D: Preparation of N-(2-aminoethyl)-3-aminopropylsiloxane 100 ml of N-(2-aminoethyl)-3-aminopropyltriethoxysilane was introduced in a 500 ml flask. Then, while ice-water bathing the flask, 100 ml of pure water was added dropwise to the flask for 10 minutes using a dropping funnel. After stirring the product in the flask for 30 minutes, the flask was taken out from the ice-water bath and the stirring was conducted at room temperature for 1 hour. Ethanol as a by-product was removed from the product under the conditions of reduced pressure (30 Torr, for 1 hour) at 60° C., to obtain Polysiloxane Compound D. After evaporating moisture in an oven, concentration of the product was measured by Weight reduction method. The yield was 47%. The molecular weight of the product was measured by GPC, and the number average molecular weight was 1,530 and the mass average molecular weight was 1,968, in terms of polystyrene.

Synthesis of Polysiloxane Compound J: Preparation of aminopropylsilsesquioxane 0.25 mol of 3-aminopropyltriethoxysilane, 0.77 mol of $Me_4NOH$ and 500 ml of methanol as a solvent were introduced in a 1,000 ml flask and the synthesis was conducted under a nitrogen atmosphere, to obtain octaaminopropylsilsesquioxane. Here, the reaction was carried out at room temperature for 24 hours and then at 60° C. for 24 hours. Then, excess $Me_4NOH$ and water were removed, and the residue was held at 110° C. for 24 hours. Finally, the residue was purified with 100 ml of n-hexane and 100 ml of toluene, to obtain Polysiloxane Compound J. Here, the molar yield was 92.7%. In addition, the molecular weight of the purified product was measured by GPC, and the number average molecular weight was 817 and the mass average molecular weight was 817, in terms of polystyrene.

Synthesis of Polysiloxane Compound K 3.47 g of tetraethoxysilane, 26.75 g of methyltri-ethoxysilane and 45.33 g of acetone were introduced in a flask. Then, while ice-water bathing the flask, 100 ml of pure water was added dropwise to the flask for 10 minutes using a dropping funnel. After stirring the product in the flask for 30 minutes, the flask was taken out from the ice-water bath and the stirring was conducted at room temperature for 1 hour.

Ethanol as a by-product was removed from the product under the conditions of reduced pressure (30 Torr, for 1 hour) at 60° C., to obtain Polysiloxane Compound K. After evaporating moisture in an oven, concentration of the product was measured by Weight reduction method. The yield was 47%. The molecular weight of the product was measured by GPC, and the number average molecular weight was 1,300 and the mass average molecular weight was 1,300, in terms of polystyrene.

Evaluation of Solubility

The above Polysiloxane Compounds A to L were mixed with the solvents shown in the following Table 1 so as to become 5 mass % with respect to the total composition, and the mixtures were stirred. Evaluation criteria are as follows. The evaluation results were as shown in Table 1.

A: After stirring, a transparent solution was observed,

B: After stirring, although uniformly dispersed, turbidity was confirmed, and

C: After stirring, without being dissolved, a precipitate was observed

TABLE 1

| | | solvent | |
| | polysiloxane compound | water | water/IPA = 70:30 |
| --- | --- | --- | --- |
| Example 101 | polysiloxane compound A | A | A |
| Example 102 | polysiloxane compound B | A | A |
| Example 103 | polysiloxane compound C | A | A |
| Example 104 | polysiloxane compound D | A | A |
| Example 105 | polysiloxane compound E | A | A |
| Example 106 | polysiloxane compound F | B | A |
| Example 107 | polysiloxane compound G | B | A |
| Example 108 | polysiloxane compound H | B | A |
| Example 109 | polysiloxane compound I | B | A |
| Example 110 | polysiloxane compound J | A | A |

TABLE 1-continued

| | polysiloxane compound | solvent water | water/IPA = 70:30 |
|---|---|---|---|
| Comparative Example 101 | polysiloxane compound K | C | B |
| Comparative Example 102 | polysiloxane compound L | C | B |

In the table, IPA is isopropyl alcohol.

For Comparative Examples 101 and 102, aqueous solvents showed poor solubility, so that solubility was confirmed using MIBC (4-methyl-2-pentanol). With respect to Comparative Examples 101 and 102, a composition using MIBC that obtained high solubility as a solvent was used for the following evaluation.

Evaluation of Film Formation Characteristics

Coatability was good for all the compositions whose evaluation of solubility was A, and a uniform film was formed. This was the same in Comparative Examples 101 and 102 in which MIBC was used as a solvent.

Evaluation of Flatness and Evaluation of Filling Properties, on a Resist Pattern:

An ArF resist (AZ AX2110P, manufactured by Merck Performance Materials, LLC, hereinafter abbreviated as manufactured by Merck) was coated on an 8-inch silicon substrate using a spin coater (MK-VIII, manufactured by Tokyo Electron Limited). Pre-baking was performed at 100° C. for 60 seconds using a hot plate, to form a resist layer having a film thickness of 120 nm. Film thickness measurement was carried out by Lambda Ace manufactured by SCREEN Semiconductor Solutions Co., Ltd. The film thickness measurement in the following test was also done by the same. The obtained substrate was exposed using an ArF stepper (NSR-S306C (trade name), manufactured by Nikon Corporation) under the exposure amount of 20 mJ/cm² with a mask being removed. This was heated under the conditions of at 110° C. for 60 seconds, then developed using a 2.38% TMAH aqueous solution, and subsequently rinsed with pure water, to produce a substrate having a resist pattern with a 2 cm×2 cm opening.

Thereafter, 10 cc of the reverse pattern formation composition shown in Table 2 (here, the mass ratio of the polysiloxane compound to the whole composition was 5%) was dropped onto the resist pattern, and coating was performed by rotating at 1,500 rpm. Thereafter, baking was performed at the baking temperature and time, which are shown in Table 2. Then, the film thickness of the opening (x, as shown in FIG. 2) and the film thickness of the non-opening (y, as shown in FIG. 2) were measured to calculate the film thickness of the level difference=y−x. Evaluation criteria for the evaluation of flatness are as follows, and the obtained results are as shown in Table 3.

A: Level difference is not more than 5 nm,
B: Level difference is more than 5 nm and not more than 10 nm, and
C: Level difference is more than 10 nm.

Further, the filling properties were evaluated by observing the cross section. Evaluation criteria of the evaluation of filling properties are as follows and the obtained results are as shown in Table 2.

A: Uniformly filled,
B: Insufficient filling was confirmed slightly in the corner of the pattern, and
C: A lot of patterns that could not be filled were confirmed.

TABLE 2

| | reverse pattern formation composition | | | evaluation of flatness | | evaluation |
|---|---|---|---|---|---|---|
| | polysiloxane compound | solvent | baking temperature/time | level difference (nm) | evaluation | of filling properties |
| Example 201 | polysiloxane compound A | water | 50° C./60 s | 3.3 | A | A |
| Example 202 | polysiloxane compound B | water | 50° C./60 s | 2.3 | A | A |
| Example 203 | polysiloxane compound C | water | 50° C./60 s | 2.5 | A | A |
| Example 204 | polysiloxane compound D | water | 50° C./60 s | 3.1 | A | A |
| Example 205 | polysiloxane compound E | water | 50° C./60 s | 2.6 | A | A |
| Example 206 | polysiloxane compound F | water/IPA = 70:30 | 50° C./60 s | 4.7 | A | A |
| Example 207 | polysiloxane compound G | water/IPA = 70:30 | 50° C./60 s | 5.8 | B | A |
| Example 208 | polysiloxane compound H | water/IPA = 70:30 | 50° C./60 s | 7.6 | B | A |
| Example 209 | polysiloxane compound I | water/IPA = 70:30 | 50° C./60 s | 7.8 | B | A |
| Example 210 | polysiloxane compound J | water | 50° C./60 s | 3.7 | A | A |
| Comparative Example 201 | polysiloxane compound K | MIBC | 110° C./60 s | 10.3 | C | B |
| Comparative Example 202 | polysiloxane compound L | MIBC | 110° C./60 s | 12.1 | C | B |

Evaluation of Pattern Roughness

AZ U98 Ctg85 (manufactured by Merck) was coated on an 8-inch silicon substrate using a spin coater and pre-baked at 250° C. for 180 seconds on a hot plate, to form a applied carbon coating underlayer having a film thickness of 300 nm. On this underlayer, an ArF resist (AZ AX2110P) was coated and pre-baked at 100° C. for 60 seconds on a hot plate, to form a resist layer having a film thickness of 120 nm. The obtained substrate was exposed using an ArF stepper, post-exposure baking was performed at 110° C. for 60 seconds, developed with a 2.38% TMAH aqueous solution, and subsequently rinsed with pure water, to produce a substrate having a resist pattern of 120 nm line-and-space pattern (1:1).

Thereafter, 10 cc of the reverse pattern formation composition (here, the mass ratio of the polysiloxane compound to the whole composition was 5%) shown in Table 3 was dropped onto the resist pattern, and coating was performed by rotating at 1,400 rpm. Thereafter, baking was carried out at the baking temperature and time, which are shown in Table 4.

The obtained substrate was etched back with $CF_4$ at 30 sccm (5 Pa, 200 W) to planarize the film surface. Then, removal of the resist pattern and etching of the applied carbon coating layer were performed with $O_2/N_2$/Ar at 4/10/25 sccm (0.67 Pa, 100 W). The cross section of the formed pattern was observed using SEM (Verity-4i (trade name), manufactured by Applied Materials, Inc.), and LWR (Line Width Roughness) and LER (Line Edge Roughness) were evaluated. The evaluation results are as shown in Table 3 below.

collapse rate of the pattern was measured with reference to the number of collapses when directly dried by spinning after developing the resist. The results are shown in Table 4.

TABLE 4

| | reverse pattern formation composition | | |
|---|---|---|---|
| | polysiloxane compound | solvent | collapse rate(%) |
| Example 401 | polysiloxane compound A | water | 5.0 |
| Example 402 | polysiloxane compound B | water | 3.3 |
| Example 403 | polysiloxane compound C | water | 4.6 |
| Example 404 | polysiloxane compound D | water | 2.6 |
| Example 405 | polysiloxane compound E | water | 5.3 |
| Example 406 | polysiloxane compound F | water/IPA = 70:30 | 3.4 |
| Example 407 | polysiloxane compound G | water/IPA = 70:30 | 4.5 |
| Example 408 | polysiloxane compound H | water/IPA = 70:30 | 7.3 |

TABLE 3

| | reverse pattern formation composition | | baking | LWR | | | LER | | |
|---|---|---|---|---|---|---|---|---|---|
| | polysiloxane compound | solvent | temp./time | ADI | ARI | (ADI − ARI)/ADI | ADI | ARI | (ADI − ARI)/ADI |
| Example 301 | polysiloxane compound A | water | 50° C./60 s | 9.9 | 7.4 | 25.3% | 7.1 | 5.1 | 28% |
| Example 302 | polylsioxane compound B | water | 50° C./60 s | 10.0 | 7.4 | 26.0% | 7.1 | 5.2 | 27% |
| Example 303 | polysiloxane compound C | water | 50° C./60 s | 9.8 | 7.1 | 26.8% | 7.1 | 5.5 | 22% |
| Example 304 | polysiloxane compound D | water | 50° C./60 s | 10.0 | 7.3 | 27.8% | 7.2 | 5.2 | 28% |
| Example 305 | polysiloxane compound E | water | 50° C./60 s | 10.0 | 7.2 | 27.7% | 7.2 | 5.5 | 24% |
| Example 306 | polysiloxane compound F | water/IPA = 70:30 | 50° C./60 s | 9.9 | 7.4 | 24.9% | 7.1 | 5.3 | 25% |
| Example 307 | polysiloxane compound G | water/IPA = 70:30 | 50° C./60 s | 10.0 | 7.9 | 21.2% | 7.1 | 5.2 | 27% |
| Example 308 | polysiloxane compound H | water/IPA = 70:30 | 50° C./60 s | 10.1 | 8.4 | 17.0% | 7.1 | 5.9 | 17% |
| Example 309 | polysiloxane compound I | water/IPA = 70:30 | 50° C./60 s | 10.0 | 8.3 | 17.2% | 7.2 | 5 | 31% |
| Example 310 | polysiloxane compound J | water | 50° C./60 s | 10.1 | 8.0 | 20.9% | 7.2 | 4.9 | 32% |
| Comparative Example 301 | polysiloxane compound K | MIBC | 110° C./60 s | 9.9 | 12.1 | −22.4% | 7.0 | 7.9 | −13% |
| Comparative Example 302 | polysiloxane compound L | MIBC | 110° C./60 s | 9.9 | 11.5 | −16.3% | 7.2 | 8.3 | −16% |

In the table, ADI is the LWR/LER after forming the resist pattern, and ARI is the LWR/LER of the pattern after etching the resist pattern and the applied carbon coating layer. The method for measuring LWR/LER is according to the LER/LWR measurement standard recommended by the International Semiconductor Roadmap Committee. From this result, it is found that the roughness in ARI is less than that in ADI in Example, whereas the former roughness is conversely larger than the latter one in Comparative Example.

Evaluation of Collapse Rate

A pattern was formed by etching the resist pattern and the applied carbon coating layer in the same manner as in the above evaluation of pattern roughness except that the resist pattern was formed as a 120 nm line-and-space pattern. The TABLE 4-continued

| | reverse pattern formation composition | | |
|---|---|---|---|
| | polysiloxane compound | solvent | collapse rate(%) |
| Example 409 | polysiloxane compound I | water/IPA = 70:30 | 5.3 |
| Example 410 | polysiloxane compound J | water | 3.8 |
| Comparative Example 401 | polysiloxane compound K | MIBC | 6.8 |
| Comparative Example 402 | polysiloxane compound L | MIBC | 7.1 |

TABLE 4-continued

| | reverse pattern formation composition | |
|---|---|---|
| | polysiloxane compound | solvent | collapse rate(%) |
| Comparative Example 403 | directly dried by spinning after developing resist | | 100.0 |

Evaluation of Etching Resistance

Dry etching was performed using $O_2$ and $CF_4$ gases respectively for a layer formed using the reverse pattern formation composition shown in Table 5 on a silicon substrate and a layer formed using the above resist on a silicon substrate, and each etching resistance was evaluated. The obtained results are shown in Table 5. The dry etching speed ratio in the table shows the etching speed of the reverse pattern formation composition/the etching speed of the resist.

TABLE 5

| | reverse pattern formation composition | | dry etching speed ratio | |
|---|---|---|---|---|
| | polysiloxane compound | solvent | $O_2$ | $CF_4$ |
| Example 501 | polysiloxane compound A | water | 0.02 | 2.01 |
| Example 502 | polysiloxane compound B | water | 0.02 | 1.98 |
| Example 503 | polysiloxane compound C | water | 0.02 | 1.97 |
| Example 504 | polysiloxane compound D | water | 0.01 | 1.89 |
| Example 505 | polysiloxane compound E | water | 0.02 | 1.81 |
| Example 506 | polysiloxane compound F | water/IPA = 70:30 | 0.01 | 1.89 |
| Example 507 | polysiloxane compound G | water/IPA = 70:30 | 0.01 | 1.75 |
| Example 508 | polysiloxane compound H | water/IPA = 70:30 | 0.02 | 1.97 |
| Example 509 | polysiloxane compound I | water/IPA = 70:30 | 0.01 | 1.78 |
| Example 510 | polysiloxane compound J | water | 0.01 | 2.00 |
| Comparative Example 501 | polysiloxane compound K | MIBC | 0.04 | 1.63 |
| Comparative Example 502 | polysiloxane compound L | MIBC | 0.05 | 1.51 |

From these results, it is found that the layer using the reverse pattern formation composition of Example has higher resistance to $O_2$, whereas has lower resistance to $CF_4$, as compared with Comparative Example.

EXPLANATION OF SYMBOLS

1. Substrate,
2. Applied carbon coating layer (Layer to be processed),
21. Applied carbon coating layer pattern,
3. Resist pattern,
4. Composition layer according to the present invention,
41. Surplus composition layer,
42. Reverse pattern,
5. Resist pattern, and
6. Coating layer.

The invention claimed is:

1. A reverse pattern formation composition, comprising:
   a polysiloxane compound which comprises a repeating unit represented by the following general formulae (I) or (II), wherein
   $R^a$ is a nitrogen-containing substituent, where said nitrogen-containing substituent contains 1 to 12 carbon atoms and the atom directly bonded to Si is carbon in said nitrogen-containing substituent, and wherein said $R^a$ comprises $—NH_2$,
   $R^b$ is a nitrogen-containing substituent, where said nitrogen-containing substituent contains 1 to 12 carbon atoms and the atom directly bonded to Si is carbon in said nitrogen-containing substituent, hydrogen, hydroxy, carboxy, $C_{1-12}$ alkyl, $C_{1-12}$ alkoxy, or $C_{1-12}$ hydroxyalkyl, and
   a solvent comprising water.

2. The composition according to claim 1, wherein said $R^a$ is $C_{1-12}$ aminoalkyl or $C_{2-12}$ N-(aminoalkyl)iminoalkyl.

3. The composition according to claim 2, wherein said $R^b$ is hydroxy or $C_{1-12}$ alkyl.

4. The composition according to claim 3, wherein the ratio of the sum of repeating units represented by general formulae (I) and (II) to the all repeating units in said polysiloxane compound is 40 mol % or more.

5. The composition according to claim 4, wherein the ratio of the number of amino groups to the number of Si atoms in said polysiloxane compound is 30% or more.

6. The composition according to claim 5, wherein the ratio of the number of hydroxy groups to the number of Si atoms in said polysiloxane compound is 70% or less.

7. The composition according to claim 1, wherein said polysiloxane compound having a repeating unit represented by the formula (II) has a $Si_8O_{12}$ structure in which Si atoms are positioned at the vertices of a hexahedron and each two Si atoms are connected to each other by way of an oxygen atom.

8. The composition according to claim 6, wherein the mass average molecular weight of said polysiloxane compound is 500 or more and 20,000 or less.

9. The composition according to claim 8, wherein the mass ratio of said polysiloxane compound to the total mass of the composition is 0.5 mass % or more and 50 mass % or less, and the mass ratio of said solvent to the total mass of the composition is 50 mass % or more and 99.5 mass % or less.

10. The composition according to claim 9, wherein the mass ratio of said water to said solvent is 60 mass % or more.

11. A reverse pattern formation method, comprising coating a developed resist pattern with a composition comprising:

a polysiloxane compound which comprises a repeating unit represented by the following general formulae (I) or (II), wherein
$R^a$ is a nitrogen-containing substituent, where said nitrogen-containing substituent contains 1 to 12 carbon atoms and the atom directly bonded to Si is carbon in said nitrogen-containing substituent, $R^b$ is a nitrogen-containing substituent, where said nitrogen-containing substituent contains 1 to 12 carbon atoms and the atom directly bonded to Si is carbon in said nitrogen-containing substituent, hydrogen, hydroxy, carboxy, $C_{1-12}$ alkyl, $C_{1-12}$ alkoxy, or $C_{1-12}$ hydroxyalkyl, and a solvent comprising water, to form a composition layer, and removing said resist pattern.

12. A processing method of a layer to be processed, comprising:
coating a layer to be processed with a resist composition, to form a resist composition layer;
exposing said resist composition layer to light;
developing the exposed resist composition layer with a developer, to form a resist pattern;
coating said resist pattern with a composition comprising:
a polysiloxane compound which comprises a repeating unit represented by the following general formulae (I) or (II), wherein
$R^a$ is a nitrogen-containing substituent, where said nitrogen-containing substituent contains 1 to 12 carbon atoms and the atom directly bonded to Si is carbon in said nitrogen-containing substituent, $R^b$ is a nitrogen-containing substituent, where said nitrogen-containing substituent contains 1 to 12 carbon atoms and the atom directly bonded to Si is carbon in said nitrogen-containing substituent, hydrogen, hydroxy, carboxy, $C_{1-12}$ alkyl, $C_{1-12}$ alkoxy, or $C_{1-12}$ hydroxyalkyl, and a solvent comprising water,
to form a composition layer;
removing said resist pattern, to form a reverse pattern; and
processing said layer to be processed using said reverse pattern as a mask.

13. The method according to claim 12, wherein said layer to be processed is an applied carbon coating layer.

14. A device manufacturing method, comprising:
coating a layer to be processed with a resist composition, to form a resist composition layer;
exposing said resist composition layer to light;
developing the exposed resist composition layer with a developer, to form a resist pattern;
coating said resist pattern with the composition according to claim 10, to form a composition layer;
removing said resist pattern, to form a reverse pattern; and
processing said layer to be processed using said reverse pattern as a mask.

* * * * *